June 27, 1967 J. T. MURRAY 3,328,718
PRECISE TUNING VOLTAGE SUPPLY FOR VARIABLE FREQUENCY OSCILLATOR
Filed July 27, 1966
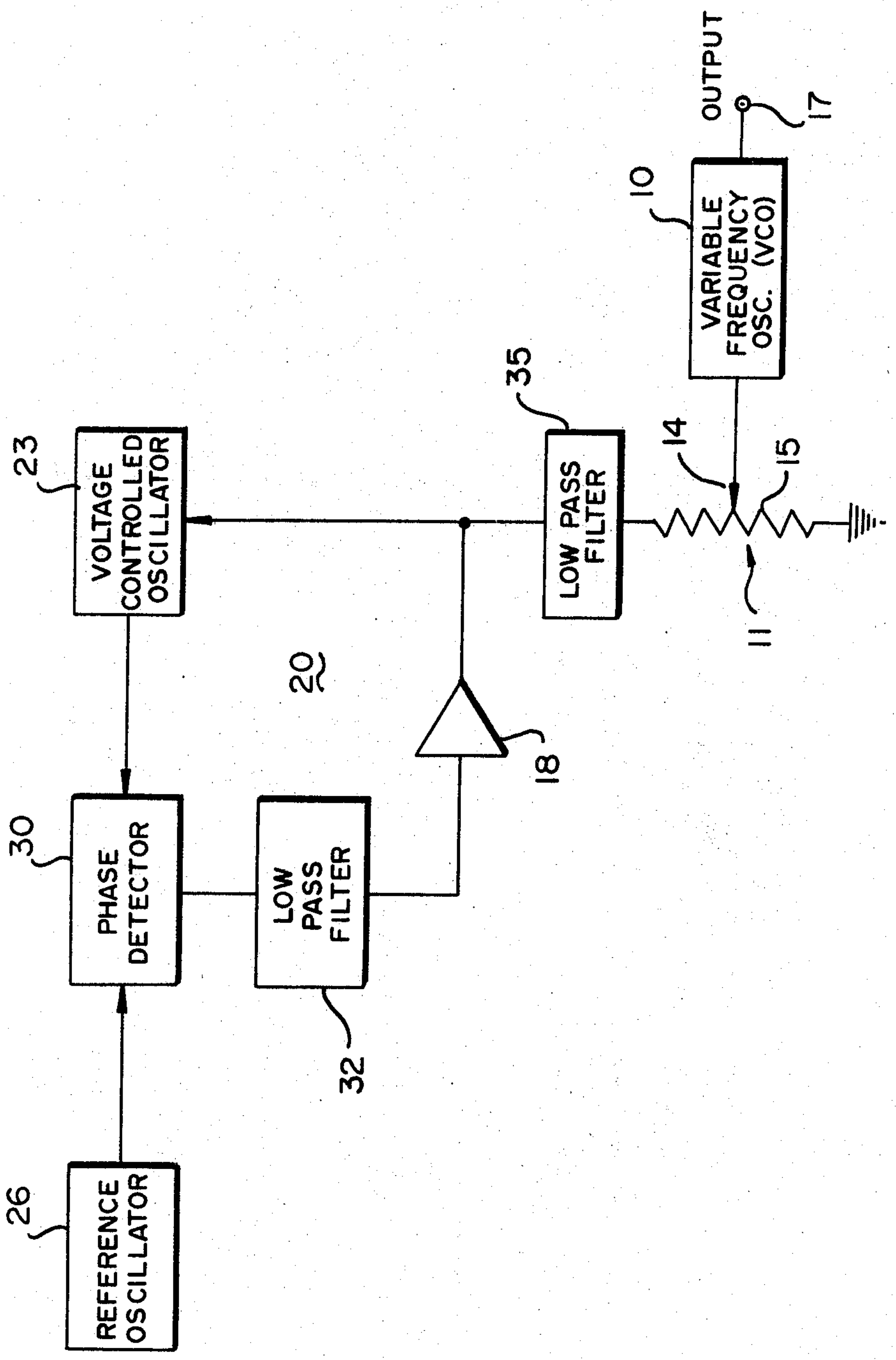
INVENTOR
JACK T. MURRAY
BY Hurwitz & Rose
ATTORNEYS

United States Patent Office 3,328,718

Patented June 27, 1967

3,328,718

PRECISE TUNING VOLTAGE SUPPLY FOR VARIABLE FREQUENCY OSCILLATOR

Jack T. Murray, Raleigh, N.C., assignor to Melpar, Inc., Falls Church, Va., a corporation of Delaware Filed July 27, 1966, Ser. No. 568,284

5 Claims. (Cl. 331—2)

The present invention relates generally to oscillators, and more particularly to means for stabilizing the control voltage for a voltage tuned variable frequency oscillator.

Voltage controlled oscillators (VCO's), of the type utilized in R-F and H-F receivers or frequency synthesizers, for example, are generally required to generate frequencies which precisely follow variations in the reference voltage supply and to maintain the desired frequency setting substantially constant over both short and long time intervals. It is of course essential that the generated frequency be independent of changes in temperature to which the oscillator or its tuning voltage supply may be subjected in order to assure frequency stability and precision. In the past, the usual practice for meeting these stringent requirements of long- and short-term stability over a wide range of temperature variations has been to provide a precise stabilized power supply from which the voltage for tuning the controlled oscillator is derived. This open-loop approach has a number of disadvantages, however, principal among which are the cost and complexity of the system required if any semblance of drift-free operation of the oscillator is to be achieved.

Accordingly, it is a principal object of the present invention to provide a relatively inexpensive and simple reference supply for generating precise stabilized control voltages for tuning controlled or variable frequency oscillators.

To this end, the present invention takes advantage of the stability of a closed loop network, a well known characteristic of such networks per se, to provide the desired reference voltage for supplying the tuning potentiometer of the voltage controlled oscillator. Briefly, the reference voltage is obtained from the output of an amplifier in a phase-locked loop containing a second voltage controlled oscillator substantially identical to the oscillator which is to supply the precise stable output frequency, a phase detector to which the outputs of the second VCO and a low power frequency standard are applied, and a low pass filter for the output signal generated by the phase detector. The filter supplies an input to the amplifier which in turn produces an output voltage applied to the second VCO. The amplifier output is employed as a stable compensated reference supply for a potentiometer from which the tuning voltage for the variable frequency oscillator is obtained. Such a circuit establishes a reference voltage that essentially exhibits the short- and long-term stability characteristics of the frequency standard.

I am aware that phase-locked loops have been used in the prior art as means for synchronizing the frequency of a controlled oscillator with that of a carrier, for example, but to my knowledge such loops have neither been provided nor recognized as a means for directly supplying precision and stabilized reference voltages to tune the output frequency of variable frequency oscillators in the manner described briefly above.

It is therefore another object of the present invention to provide a voltage tuned variable frequency oscillator having a closed loop reference voltage supply.

Still another object of the invention is to provide a precision stabilized control voltage supply employing a closed loop in which a voltage controlled oscillator is phase locked to a frequency standard, the control voltage obtained from the loop being utilized to tune the frequency of a variable frequency oscillator.

The above and still further objects, features and attendant advantages of the invention will become apparent from a consideration of the following detailed description of a preferred embodiment thereof, especially when taken in conjunction with the accompanying drawing, in which the sole figure is a block diagram of a preferred embodiment of the invention.

Referring now more specifically to the drawing, a conventional voltage controlled oscillator 10 having a voltage tuned variable frequency output, ranging for example from 1.955 to 2.955 megacycles, is supplied with tuning voltage from a potentiometer 11. The output frequency setting of oscillator 10 is controlled by appropriate adjustment of the slider 14 of potentiometer 11 to divide the voltage existing between the terminals of resistor 15. The output of oscillator 10 is taken from terminal 17 for use in any of a number of conventional applications, such as the search or interpolation frequency of a frequency synthesizer or a variable frequency for R-F or H-F receivers. Adjustment of slider 14 may be effected manually, or automatically by means of well known servo techniques, to achieve the desired tuning of the oscillator frequency range for a particular application.

The reference or supply voltage for potentiometer 11 is derived from the output of amplifier 18 in phase-locked loop 20. Loop 20 includes a second voltage controlled oscillator 23, preferably identical or substantially identical to oscillator 10, whose output is phase-locked to a frequency standard 26, such as a crystal oscillator, via phase detector 30, low pass filter 32 and amplifier 18. To this end, the outputs of both frequency standard 26 and VCO 23 are fed as inputs to the phase detector which operates as a multiplier to produce an output proportional to the product of the RMS or effective values of the two input signals. The output of the phase detector is fed to low pass filter 32, which is utilized to establish the noise bandwidth of loop 20 so that the loop noise spectral characteristics are essentially the sum of a low-pass component from standard or reference oscillator 26 and a high-pass component from voltage controlled oscillator 23. The high-pass component attributable to VCO 23 may be limited, if desired, by the inclusion of a second low pass filter 35 between the point from which the output voltage of amplifier 18 is taken for the reference supply voltage and the high side of potentiometer 11 (i.e., the terminal of resistor 15 remote from ground potential).

In operation of the circuit, crystal oscillator 26 operates with relatively low output power but provides an extremely stable and precise oscillation frequency as an input to the phase detector. Since the oscillation frequency of VCO 23 is phase locked to the crystal oscillator frequency from the output of the detector which is filtered, amplified and fed back as an input to oscillator 23, it follows that the derived voltage at the output of amplifier 18 in the phase-locked state possesses the accuracy, long-term stability and temperature characteristics of frequency standard 26. This is the voltage which is applied to the high side of potentiometer 11 as the reference voltage therefor.

In practice, it is desirable that the frequencies of standard or fixed frequency oscillator 26 and variable frequency 10 never coincide, in order to avoid interference therebetween. Hence, oscillator 26 may have a fixed frequency of 3.0 megacycles/second for the previously stated exemplary range of 1.955–2.955 mc./s. of variable frequency oscillator 10. An unused portion (dead space) of the potentiometer or a separate resistor (not shown) is therefore provided at the high end of the potentiometer.

While I have disclosed a preferred embodiment of my invention, it will be apparent that variations in the specific details of construction which have been illustrated and described may be resorted to without departing from the spirit and scope of the invention, as defined in the appended claims.

I claim:

1. A tuning voltage supply for a voltage tuned variable frequency oscillator, comprising a reference oscillator having a stable fixed frequency of oscillation, a voltage controlled oscillator having a variable oscillation frequency, a phase detector responsive to the output signals of said reference oscillator and said controlled oscillator for generating an output proportional to the product of the effective values thereof, an amplifier, a low pass filter for supplying the output of said detector to said amplifier, means for applying the output voltage of said amplifier to said voltage controlled oscillator as an input thereof, a potentiometer having a variable voltage tap, means coupling the output voltage of said amplifier to said potentiometer as the reference voltage supply therefor, and means connecting said voltage tuned variable frequency oscillator to said variable voltage tap to provide the tuning voltage for the last-named oscillator.

2. The combination according to claim 1 wherein said voltage controlled oscillator is substantially identical to said voltage tuned variable frequency oscillator.

3. The combination according to claim 2 wherein said fixed frequency of said reference oscillator is outside the range of frequencies over which said voltage tuned variable frequency oscillator is variable.

4. The combination according to claim 3 wherein said reference oscillator is a crystal oscillator.

5. The combination according to claim 1 wherein said means coupling the amplifier output voltage to said potentiometer includes a further low pass filter.

No references cited.

ROY LAKE, *Primary Examiner.*

J. KOMINSKI, *Assistant Examiner.*